(12) United States Patent
Hu et al.

(10) Patent No.: US 9,318,429 B2
(45) Date of Patent: Apr. 19, 2016

(54) INTEGRATED STRUCTURE IN WAFER LEVEL PACKAGE

(71) Applicant: Taiwan Semiconductor Manufacturing Company, Ltd., Hsin-Chu (TW)

(72) Inventors: Yu-Hsiang Hu, Hsin-Chu (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 14/304,185

(22) Filed: Jun. 13, 2014

(65) Prior Publication Data

US 2015/0279776 A1 Oct. 1, 2015

Related U.S. Application Data

(60) Provisional application No. 61/972,926, filed on Mar. 31, 2014.

(51) Int. Cl.
| | |
|---|---|
| *H01L 23/498* | (2006.01) |
| *H01L 21/56* | (2006.01) |
| *H01L 21/48* | (2006.01) |
| *H01L 21/02* | (2006.01) |
| *H01L 21/311* | (2006.01) |

(52) U.S. Cl.
CPC .... *H01L 23/49861* (2013.01); *H01L 21/02282* (2013.01); *H01L 21/31127* (2013.01); *H01L 21/481* (2013.01); *H01L 21/486* (2013.01); *H01L 21/4853* (2013.01); *H01L 21/565* (2013.01); *H01L 23/49805* (2013.01); *H01L 23/49811* (2013.01); *H01L 23/49827* (2013.01); *H01L 23/49838* (2013.01)

(58) Field of Classification Search
CPC ............ H01L 21/02282; H01L 21/31127; H01L 21/481; H01L 21/4853; H01L 21/486; H01L 21/565; H01L 23/49805; H01L 23/49811; H01L 23/49827; H01L 23/49832; H01L 23/49861
USPC ........................................ 257/668; 438/127
See application file for complete search history.

(56) References Cited

U.S. PATENT DOCUMENTS

| | | | |
|---|---|---|---|
| 2011/0042796 A1 | 2/2011 | Chang et al. | |
| 2014/0008809 A1 | 1/2014 | Scanlan | |
| 2014/0252647 A1* | 9/2014 | Huang | ............. H01L 23/49827 257/774 |
| 2014/0262475 A1* | 9/2014 | Liu | ....................... H01L 23/552 174/377 |

* cited by examiner

*Primary Examiner* — Daniel Shook
(74) *Attorney, Agent, or Firm* — Slater & Matsil, L.L.P.

(57) ABSTRACT

An embodiment device package includes a die having a conductive pillar and a molding compound extending along sidewalls of the die. The molding compound at least partially covers a top surface of the die. The device package further includes a conductive via extending through the molding compound and a redistribution layer (RDL) over the molding compound. The RDL and the molding compound have a continuous interface extending from the conductive via to a point over the die.

20 Claims, 13 Drawing Sheets

INTEGRATED STRUCTURE IN WAFER LEVEL PACKAGE

PRIORITY CLAIM AND CROSS-REFERENCE

This application claims the benefit of U.S. Provisional Application No. 61/972,926, filed on Mar. 31, 2014, entitled "Integrated Fan-out (InFo) Structure in Wafer Level Package," which application is hereby incorporated herein by reference

BACKGROUND

In an aspect of conventional packaging technologies, such as fan-out packaging, redistribution layers (RDLs) may be formed over a die and electrically connected to active devices in a die. Input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

Integrated Fan Out (InFO) package technology is becoming increasingly popular, particularly when combined with Wafer Level Packaging (WLP) technology. Such resulting package structures provide for high functional density with relatively low cost and high performance packages. Oftentimes, polymers, such as polyimides, polybenzoxazole (PBO), and the like are used as passivation, insulation, and/or protection layers when forming RDLs in an InFO device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, a new structure for polymer film coating (e.g., for RDL structures) on a continuous molding compound surface is disclosed, which reduces or prevents polymer layer de-wetting (delamination) issues. Polymer delamination and de-wetting may result from a discontinuous surface between a polymer layer and a molding compound formed in contact with the polymer layer. It has been observed that de-wetting of a polymer layer frequently occurs at a boundary of the die edge between a first polymer layer (e.g., a passivation layer) over the die and the molding compound, which may be disposed adjacent sidewalls of the die and the first polymer layer. This may be due, in part, to low interface surface area and a difference in the adhesion/contact angle between the first polymer layer and the molding compound.

Described below is a structure having a continuous molding compound surface, which may avoid or reduce polymer de-wetting/delamination issues at die edges. In some embodiments, the first polymer layer may be a conformal layer with a tapered sidewall over a die. The tapered sidewall may allow for increased surface area at an interface between the first polymer layer and the molding compound, thus improving adhesion. In other embodiments, the first polymer layer may be a non-conformal layer. The continuous molding compound may be disposed over the first polymer layer, and additional polymer layers (e.g., redistribution layers (RDLs)) may be formed over the continuous molding compound surface. The additional polymer layers may be separated from forming an interface with the first polymer layer by the molding compound. Embodiments described herein are easily integrated into packaging processes, are compatible with wafer level packaging (WLP) applications, and may reduce polymer de-wetting issues and improve yield.

Figure 1:
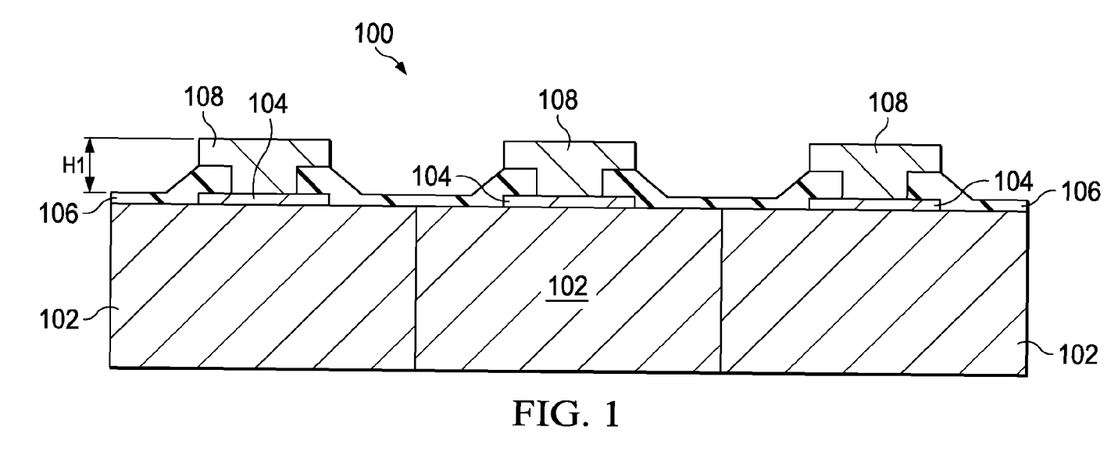
FIGS. 1 through 14 illustrate cross-sectional views of steps in the manufacture of a device package in accordance with some embodiments.

FIGS. 1 through 14 schematically illustrates cross-sectional views of intermediary steps of manufacturing an integrated fan-out (InFO) package in accordance with various embodiments. Turning to FIG. 1, a portion of wafer 100 having a plurality of dies 102 is shown. In some embodiments, functional tests (e.g., electrical connection and stress tests) may be performed on wafer 100, and dies 102 may have passed such functional tests. For example, dies 102 may be known good dies (KGDs).

Each die 102 may be a semiconductor die and could be any type of integrated circuit, such as a processor, logic circuitry, memory, analog circuit, digital circuit, mixed signal, and the like. Die 102 may include a substrate, active devices, and an interconnect structure (not shown). The substrate may be a bulk silicon substrate although other semiconductor materials including group III, group IV, and group V elements may also be used. Alternatively, the substrate may be a silicon-on-insulator substrate, a germanium-on-insulator substrate, and the like. Active devices such as transistors may be formed at the top surface of the substrate. An interconnect structure may be formed over the active devices and the substrate.

The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.8 disposed between such conductive features. In some embodiments, the ILD and IMDs may be made of, for example, silicon oxide, SiCOH, and the like. The interconnect structure electrically connect various active devices to form functional circuits within each die 102.

Input/output (I/O) and passivation features may be formed over the interconnect structure. For example, contact pads 104 may be formed over the interconnect structure and may be electrically connected to the active devices through the various conductive features in the interconnect structure. Contact pads 104 may comprise a conductive material such as aluminum, copper, and the like. Furthermore, a passivation layer 106 may be formed over the interconnect structure and the contact pads. In some embodiments, passivation layer 106 may be formed of non-organic materials such as silicon oxide, un-doped silicate glass, silicon oxynitride, and the like. Other suitable passivation materials may also be used. Portions of passivation layer 106 may cover edge portions of the contact pads 104.

Conductive pillars 108 may be disposed over contact pads 104 and passivation layer 106. In some embodiments, conductive pillars 108 comprise copper although other suitable materials (e.g., metals and/or metal alloys) may also be used for conductive pillars 108. Conductive pillars 108 may extend through an opening in passivation layer 106 and electrically connect to contact pad 104. Conductive pillars 108 may have a height H1 of about 5 µm to about 20 µm, for example. Conductive pillars 108 may further extend laterally past edges of passivation layer 106 and cover portions of passivation layer 106.

The various features of dies 102 may be formed by any suitable method and are not described in further detail herein. Furthermore, the general features and configuration of dies 102 described above are but one example embodiment, and dies 102 may include any combination of any number of the above features as well as other features. For example, each die 102 may include multiple contact pads 104 and conductive pillars 108.

Figure 2:
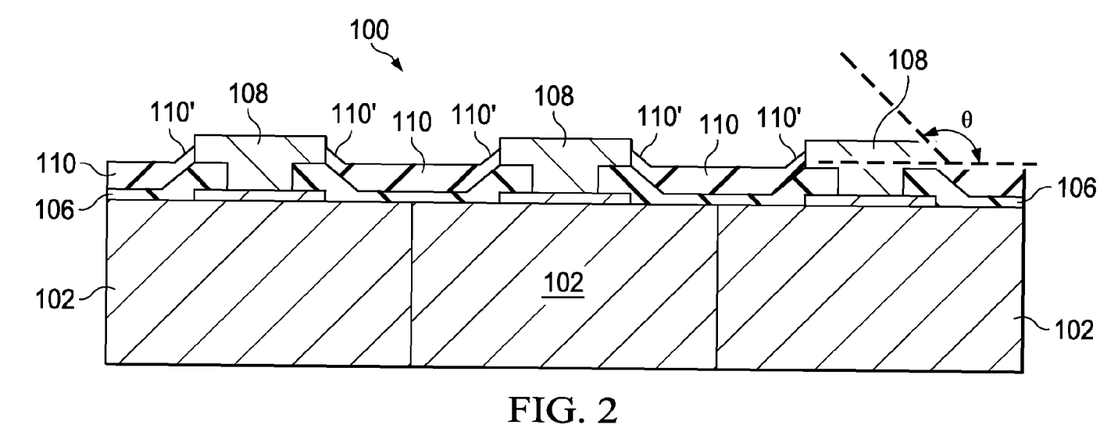

Another passivation layer 110 is formed atop dies 102 as illustrated by FIG. 2. Passivation layer 110 leaves at least a portion of conductive pillars 108 exposed. In the illustrated embodiment, passivation layer 110 is a polymer layer comprising, for example, polyimide (PI), polybenzoxazole (PBO), benzocyclobuten (BCB), epoxy, silicone, acrylates, nano-filled pheno resin, siloxane, a fluorinated polymer, polynorbornene, and the like. Alternatively, passivation layers 110 may be a dielectric layer, such as silicon nitride, silicon oxide, silicon oxynitride, and the like. Passivation layer 110 acts as an interfacial, insulation, and/or protection layer for the formation of additional package features over dies 102 in subsequent process steps. In some embodiments, passivation layer 110 improves adhesion, provides insulation, and/or prevents damage to underlying passivation layer 106 in subsequent process steps.

Passivation layer 110 may be deposited or otherwise formed in a patterned manner to leave conductive pillar 108 at least partially exposed. For example, passivation layer 110 may be deposited using a spin-on coating process. The parameters of the spin-on coating process may be selected so that the deposition of passivation layer 110 leaves conductive pillars 108 exposed. For example, spin-speed, amount of passivation material used, and the like may be controlled so that passivation layer does not cover or extend above top surfaces of conductive pillars 108 after deposition.

Furthermore, the spin-on coating process may deposit passivation layer 110 as a conformal layer having tapered sidewalls 110' adjacent conductive pillars 108. Tapered sidewalls 110' may extend along sidewalls of conductive pillars 108. Tapered sidewalls 110' have an obtuse angle θ relative a horizontal plane. The horizontal plane is substantially parallel to the major surface of wafer 100/dies 102. In some embodiments, angle θ is about 110° to about 170°. It has been observed that by configuring passivation layer 110 to have tapered sidewalls with an angle in this range, adhesion may be improved between passivation layer 110 and a subsequently formed molding compound (e.g., molding compound 220) as explained in greater detail in subsequent paragraphs.

Figure 3A:
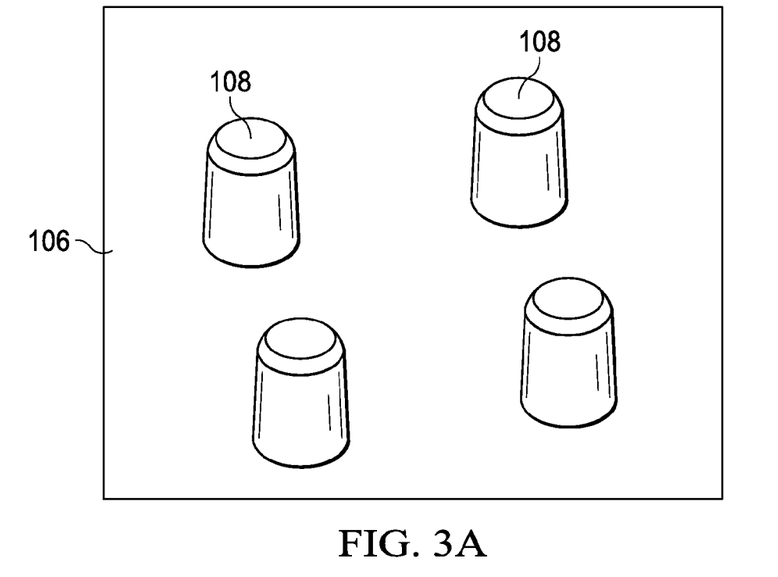
Figure 3B:
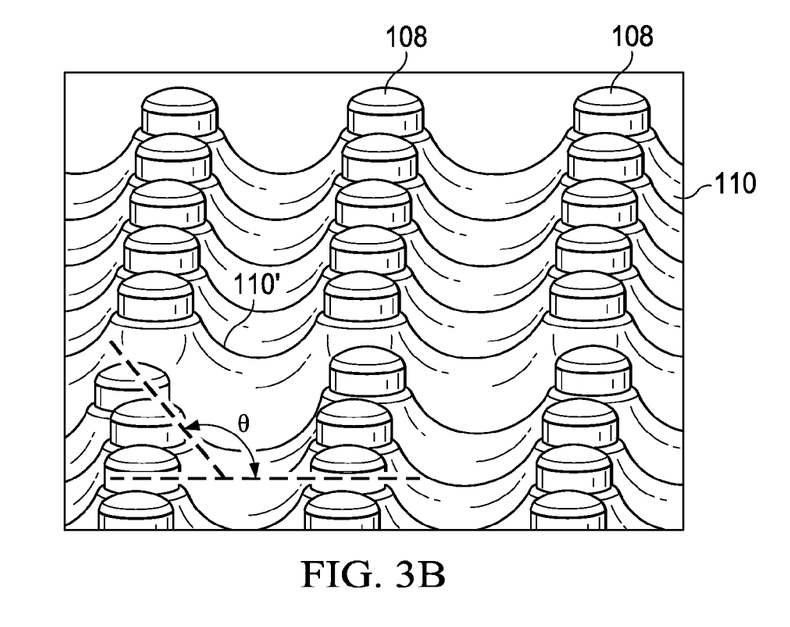

FIG. 3A illustrates both schematically and by photomicrograph details of exemplary conductive pillars 108. In the illustrated embodiment, conductive pillars 108 are copper pillars formed atop each die 102. FIG. 3A illustrates conductive pillars 108 before passivation layer 110 is formed. FIG. 3B illustrates both schematically and by photomicrograph details of exemplary conductive pillars 108 after passivation layer 110 is formed. Conductive pillars 108 are at least partially exposed through passivation layer 110 in order to allow for subsequent electrical contact to the respective conductive pillars 108. As illustrated by FIG. 3B, passivation layer 110 may be a conformal layer having tapered sidewalls 110' extending along conductive pillars 108. Tapered sidewalls 110' may have an obtuse angle θ relative a horizontal plane of about 110° to about 170° for improved adhesion.

Figure 4A:
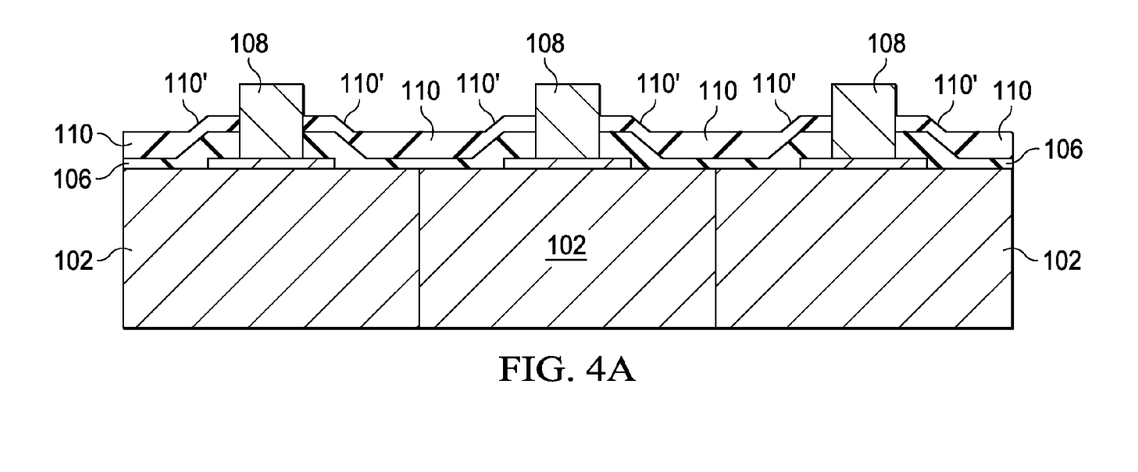
Figure 4B:
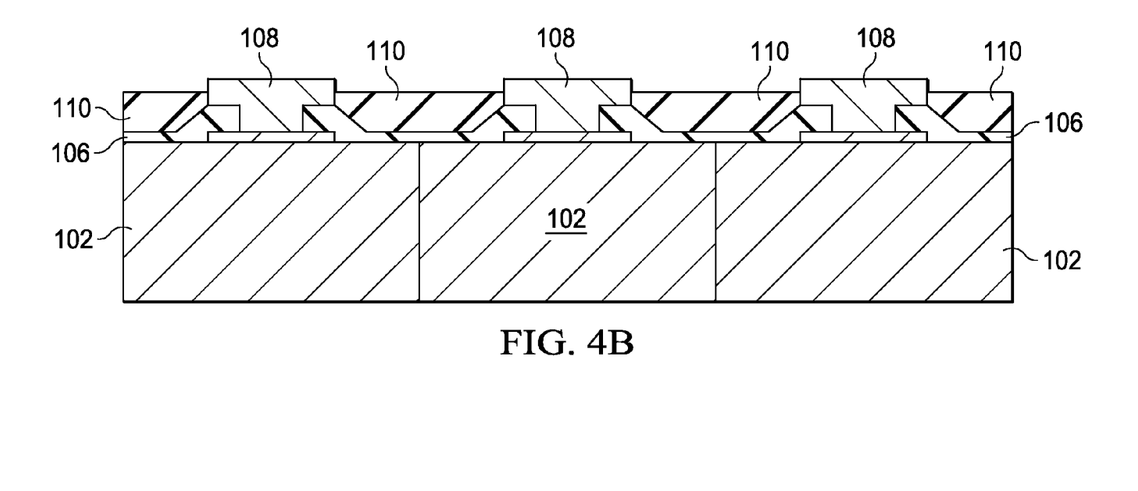
Figure 4C:
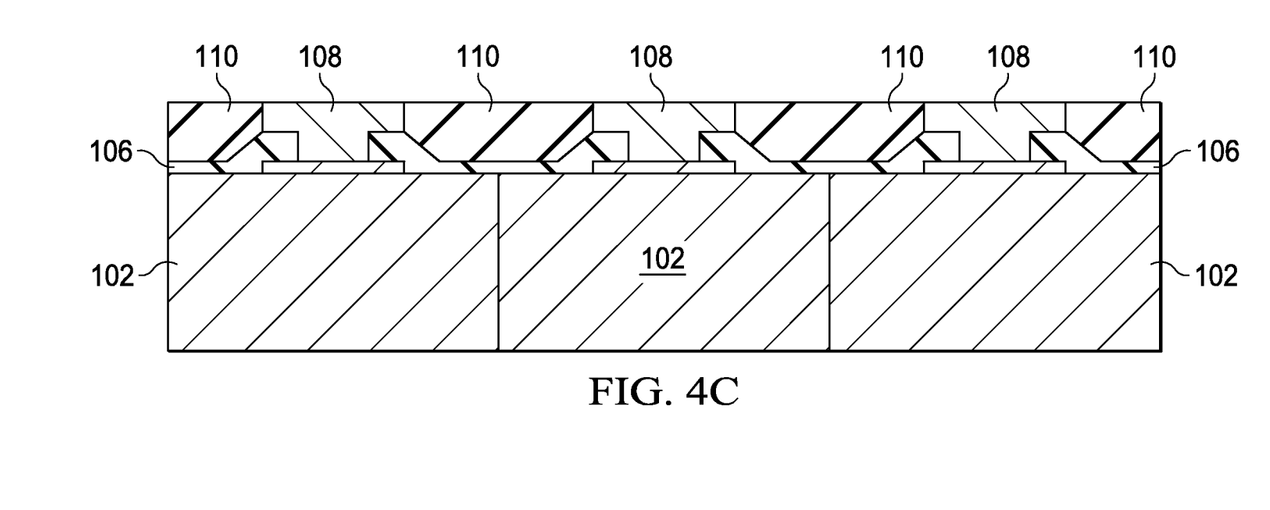

FIGS. 4A through 4C illustrate alternative configurations of conductive pillars 108 and/or passivation layer 110. For example, as illustrated in FIG. 4A, conductive pillars 108 may have substantially rectangular in configuration. Conductive pillars 108 may not extend laterally past edges of or cover portions of passivation layer 106. Other configurations of conductive pillars 108 may also be used. For example, conductive pillars 108 may be any type of suitable contact, such as, a contact pad, a top metallization layer, and the like.

FIGS. 4B and 4C illustrates an alternative configuration of passivation layer 110. As illustrated by FIGS. 4B and 4C, passivation layer 110 may not be a conformal layer. For example, passivation layer 110 may not include tapered sidewalls 110', and a top surface of passivation layer 110 may be substantially level. In such embodiments, passivation layer 110 could be blanket deposited or otherwise formed (e.g., using a sputtering technique, and the like) on the top surface of dies 102 and then patterned (e.g., using photolithography, an etch back technique, a planarization process, chemical mechanical polish (CMP), combinations thereof, and the like) to expose at least a portion of conductive pillars 108. After patterning, top surfaces of conductive pillars 108 may be higher than a top surface of passivation layer 110 as illustrated by FIG. 4B. For example, the patterning process may include a wet or dry etching process using a chemical etchant that selectively etches passivation layer 110 without etching conductive pillars 108. The chemical etchant may have a higher etch selectivity to conductive pillars 108 compared to passivation layer 110. Alternatively, after patterning, top surfaces of conductive pillars 108 may be substantially level with a top surface of passivation layer 110 as illustrated by FIG. 4C.

Figure 5:
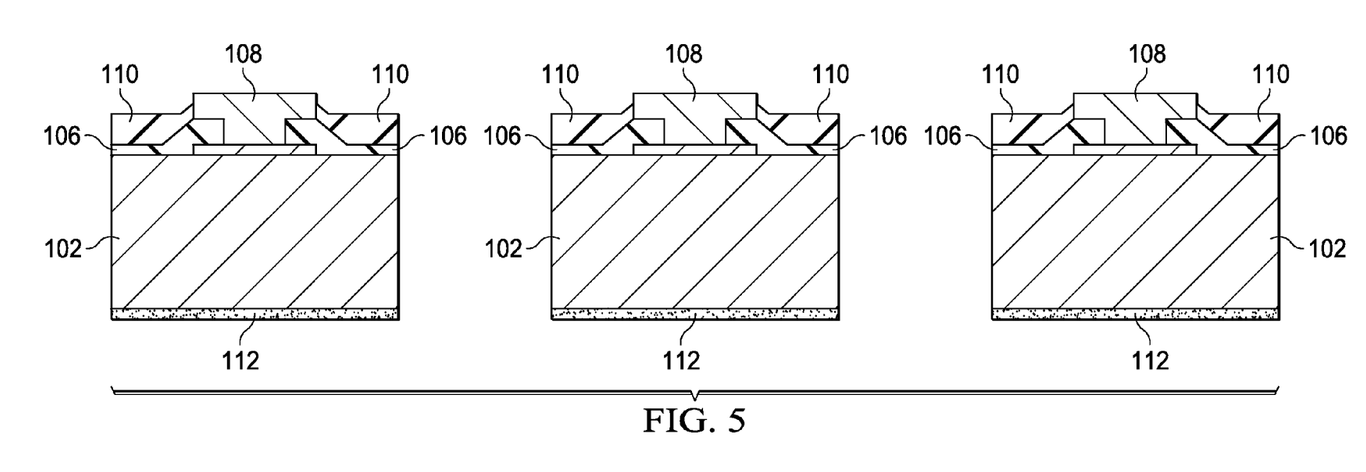

Referring now to FIG. 5, dies 102 may be separated in accordance with some embodiments. After passivation layer 110 is formed over wafer 100, wafer 100 may be thinned to a desired thickness, for example, by performing a mechanical grinding, a chemical mechanical polish (CMP), an etching process, and the like on a backside of dies 102. An adhesive layer 112 (e.g., a die attach film (DAF), and the like) may be disposed on a backside of wafer 100. Adhesive layer 112 may be formed on a side of dies 102 opposite passivation layer 110. Subsequently, dies 102 may be singulated. For example, a die saw may be performed along scribe lines disposed between dies 102 to separate each die 102 from wafer 100.

Figure 6:
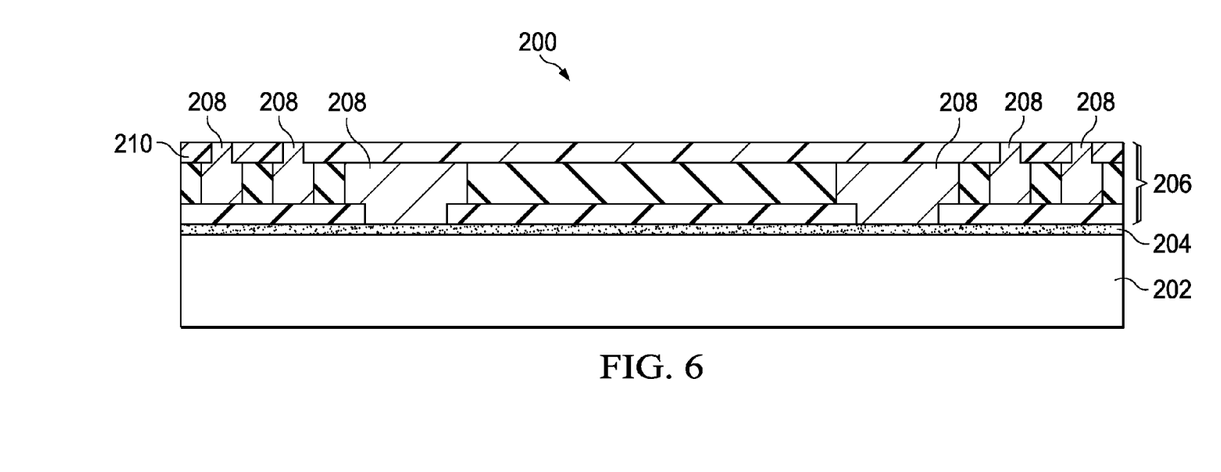

FIGS. 6 through 9 illustrate various intermediary steps of forming various features of device package 200 prior to the mounting of dies 102. Subsequently, in FIG. 11, dies 102 may be integrated with package 200. In FIG. 6, a carrier 202 is provided. Carrier 202 may comprise glass, ceramic, or other suitable material, and carrier 202 provides structural support during the formation of various features in device package 200. A temporary adhesive layer 204 (e.g., a glue layer, a light-to-heat conversion (LTHC) coating, an ultraviolet (UV) film, and the like) is disposed over carrier 202.

Subsequently, backside RDLs 206 are formed over adhesive layer 204 and carrier 202. RDLs 116 may include conductive features 208 (e.g, conductive lines and/or vias) formed in one or more polymer layers 210. Polymer layers 210 may be formed of any suitable material (e.g., PI, PBO, BCB, epoxy, silicone, acrylates, nano-filled pheno resin, siloxane, a fluorinated polymer, polynorbornene, and the like) using any suitable method, such as, a spin-on coating technique, sputtering, and the like.

Conductive features 208 may be formed in polymer layers 210. The formation of such conductive features may include patterning polymer layers 210 (e.g., using a combination of photolithography and etching processes) and forming the conductive features 208 in patterned polymer layers 210 (e.g., by depositing a seed layer and using a mask layer to define the shape of conductive features 208). Conductive features 208 may be designed to form functional circuits and input/output features for subsequently attached dies (e.g., dies 102).

Figure 7:
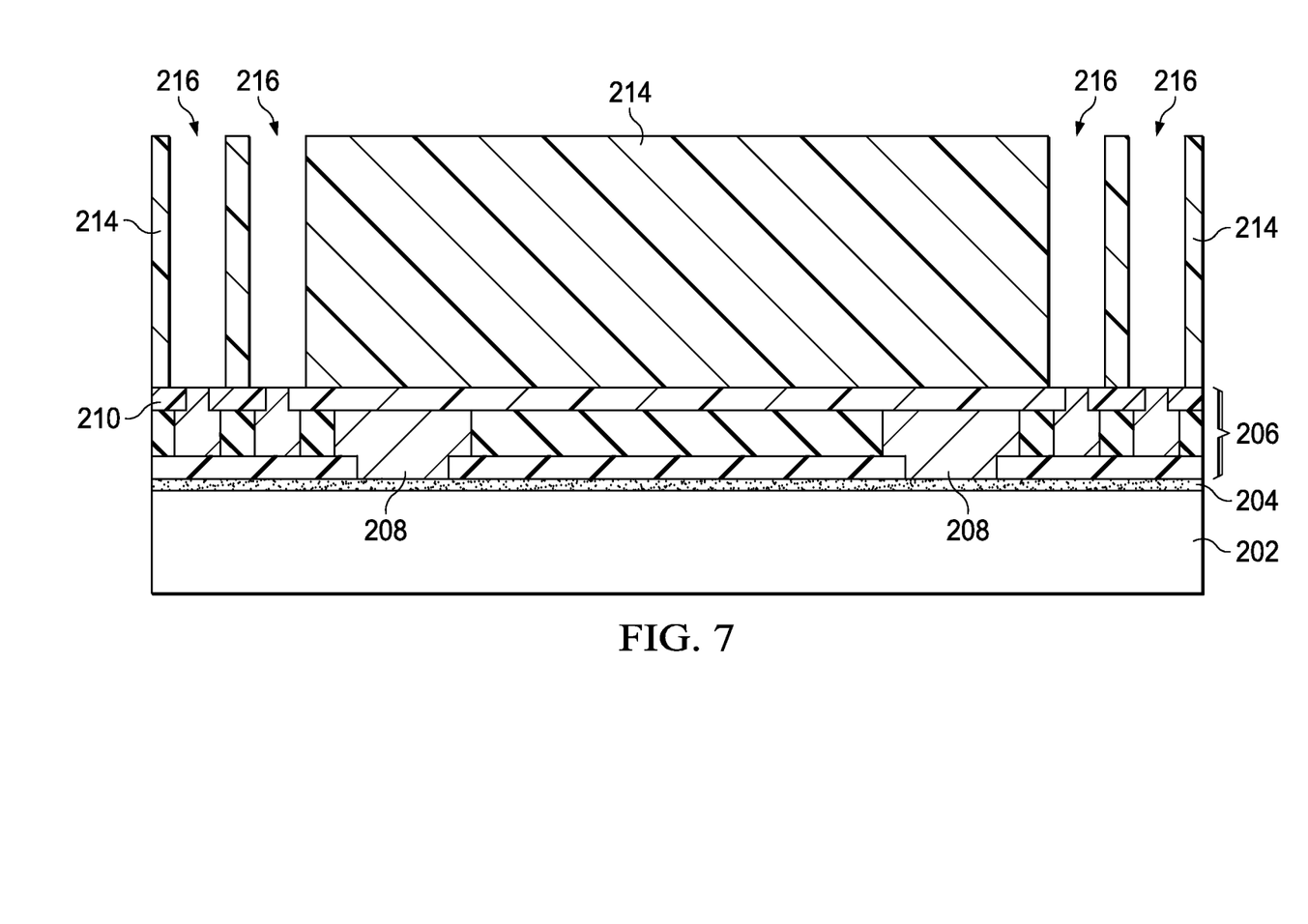

Next, as illustrated by FIG. 7, a patterned photoresist 214 may be formed over backside RDLs 206 and carrier 202. For example, photoresist 214 may be deposited as a blanket layer over backside RDLs 206. Next, portions of photoresist 214 may be exposed using a photo mask (not shown). Exposed or unexposed portions of photoresist 214 are then removed depending on whether a negative or positive resist is used. The resulting patterned photoresist 214 may include openings 216, which may be disposed at peripheral areas of carrier 202. Openings 216 may further expose conductive features 208 in backside RDLs 206.

Figure 8:
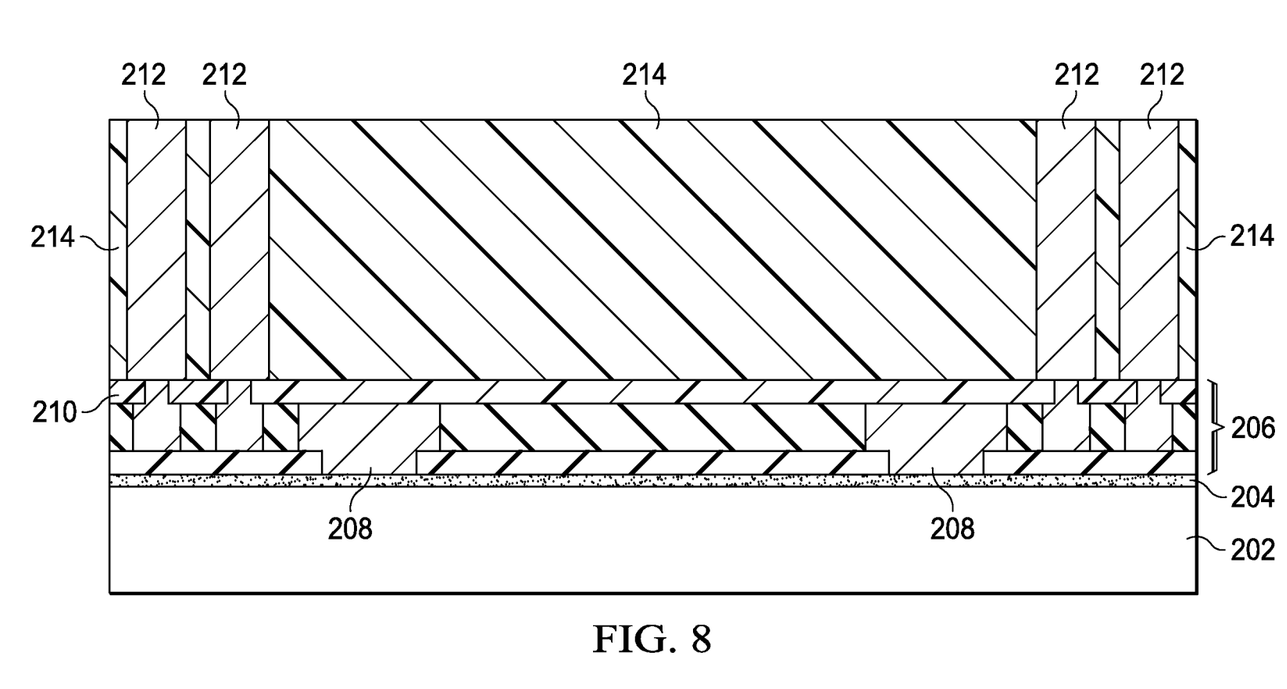

FIG. 8 illustrates the filling of openings 216 with a conductive material such as copper, silver, gold, and the like to form conductive vias 212. The filling of openings 216 may include first depositing a seed layer (not shown) and plating openings 216 (e.g., electro-chemically plating, electroless plating, and the like) with a conductive material. The conductive material may overfill openings 216, and a CMP may be performed to remove excess portions of the conductive material over photoresist 214.

Figure 9:
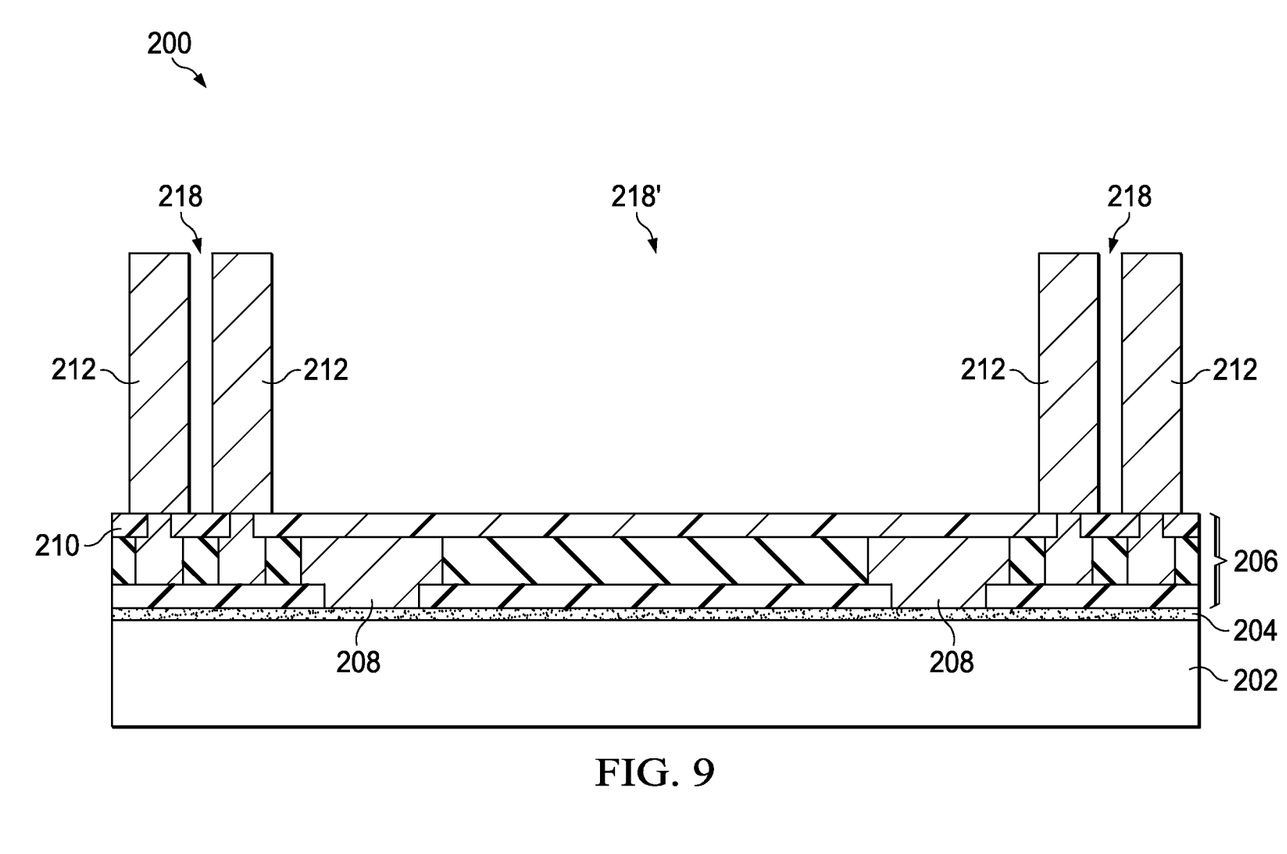

Next, as illustrated by FIG. 9, photoresist 214 is removed. A plasma ashing or wet strip process may be used to remove photoresist 214. Optionally, the plasma ashing process may be followed by a wet dip in a sulfuric acid ($H_2SO_4$) solution to clean package 200 and remove remaining photoresist material.

Thus, conductive vias 212 are formed over backside RDLs 206. Alternatively, conductive vias 212 may be replaced with conductive studs or conductive wires (e.g., copper, gold, or silver wire). Conductive vias 212 may be spaced apart from each other by openings 218. At least one opening 218' between adjacent conductive vias 212 may be large enough to dispose one or more semiconductor dies (e.g., dies 102) therein.

Figure 10:
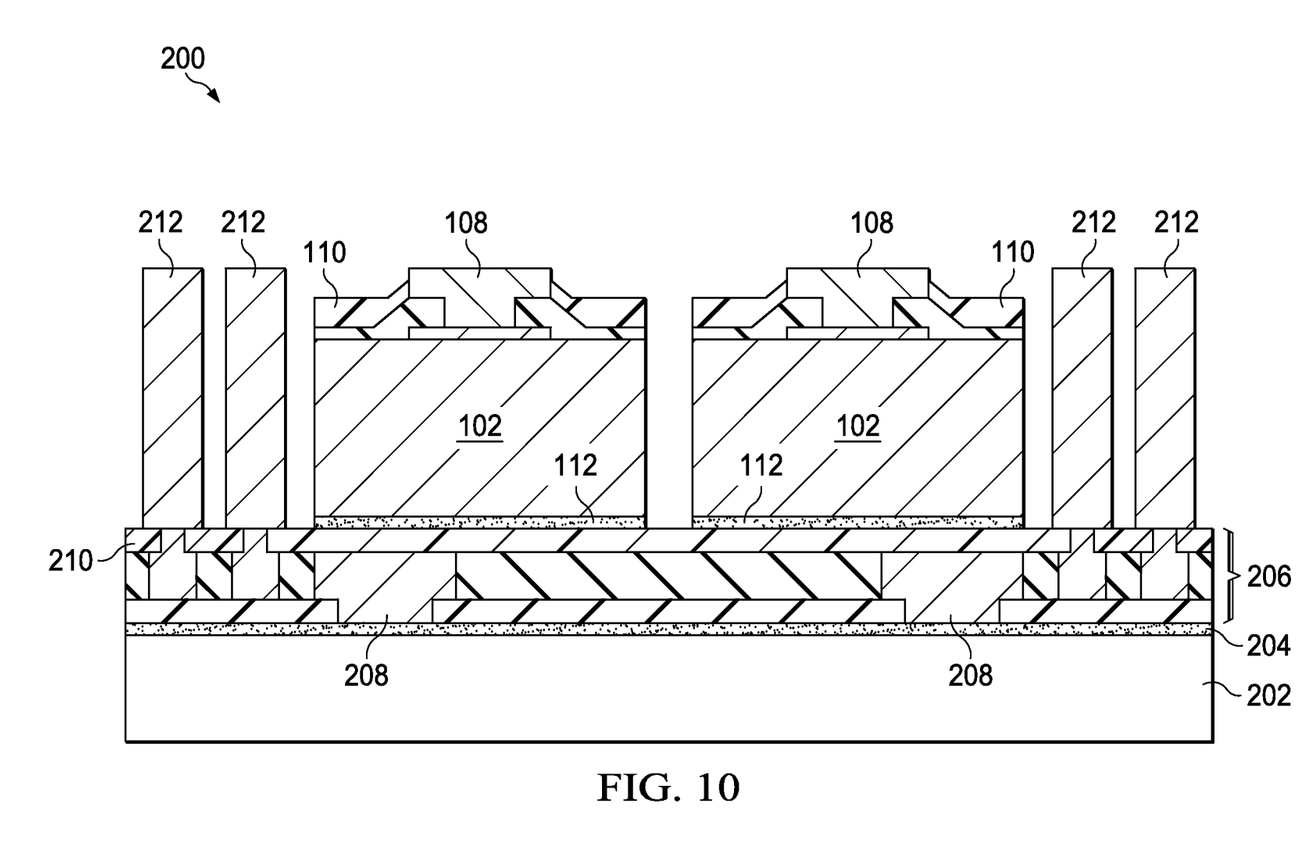

Next, as illustrated in FIG. 10, one or more dies 102 (e.g., as formed in FIGS. 1 through 5) are mounted to a device package 200. Device package 200 may include a carrier 202, and one or more interconnect layers (e.g., a backside redistribution layers (RDLs) 206 having conductive features 208) as shown. Other interconnect structures such as conductive vias 212 electrically connected to conductive features 208 in backside RDLs 206 may also be included. Adhesive layer 112 may be used to affix dies 102 to backside RDLs 206. In the illustrated embodiment, two dies 102 are mounted to device package 200, although one die or more than two die are also contemplated. Furthermore, dies 102 may be the same or different dies depending on package configuration.

Figure 11:
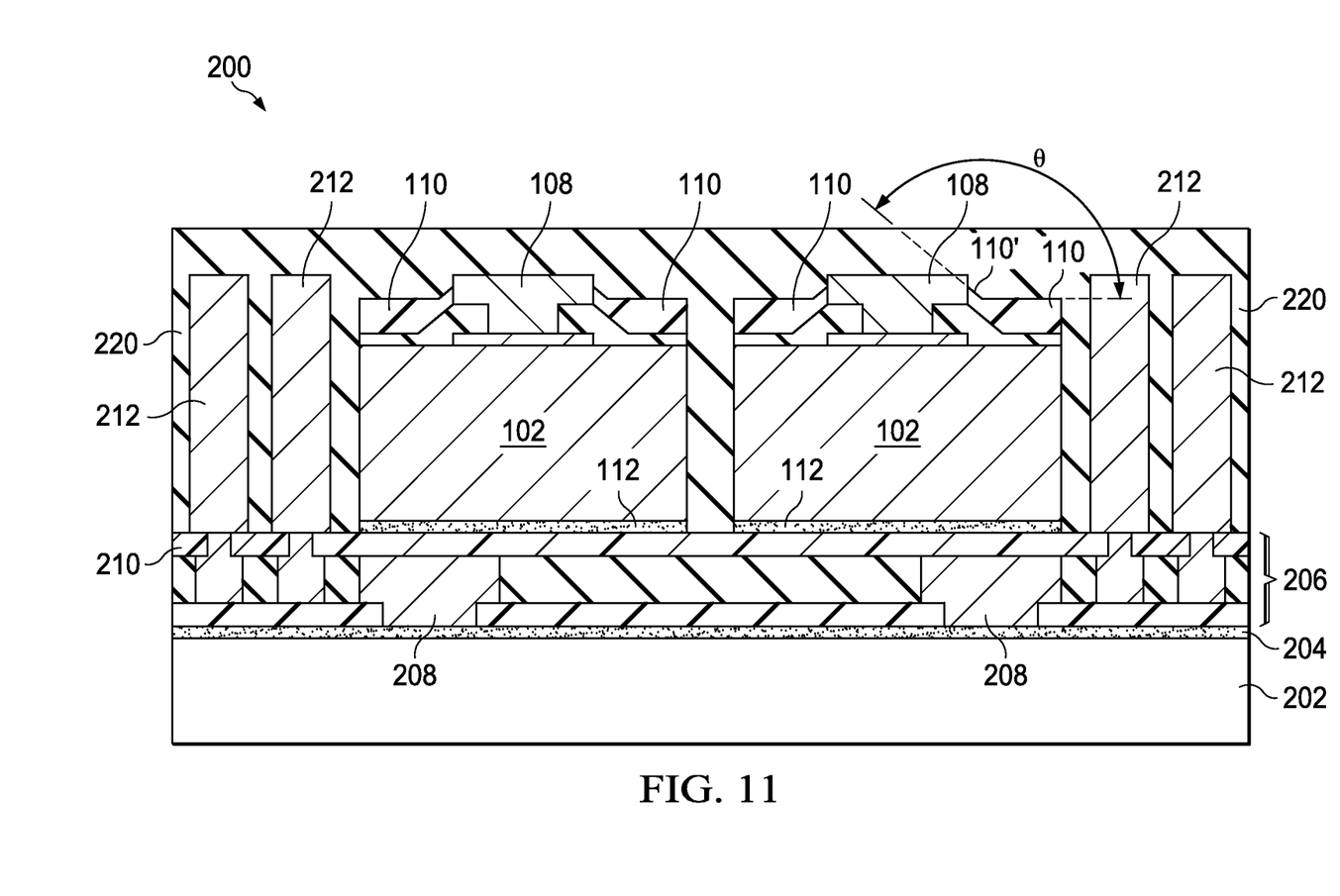

Referring next to FIG. 11, a molding compound 220 may be formed over package 200 after dies 102 are mounted to backside RDLs 206 in opening 218'. Molding compound 220 is dispensed to fill gaps between dies 102 and conductive vias 212. Molding compound 220 may include any suitable material such as an epoxy resin, a molding underfill, and the like. Suitable methods for forming molding compound 220 may include compressive molding, transfer molding, liquid encapsulent molding, and the like. For example, molding compound 220 may be dispensed between dies 102/conductive vias 212 in liquid form. Subsequently, a curing process is performed to solidify molding compound 220. The filling of molding compound 220 may overflow dies 102/conductive vias 212 so that molding compound 220 covers top surfaces of dies 102/conductive vias 212.

In embodiments where passivation layer 110 is a conformal layer having tapered sidewalls 110', adhesion may be increased between dies 102 and molding compound 220. For example, tapered sidewalls 110' may have obtuse angle θ relative a horizontal plane of about 110° to about 170°. By configuring sidewalls 110' to have an obtuse angle, the surface area of interfaces between passivation layer 110 and molding compound 220 is increased. Thus, contact points between passivation layer 110 and molding compound 220 are increased, improving adhesion and reducing de-wetting issues.

Figure 12:
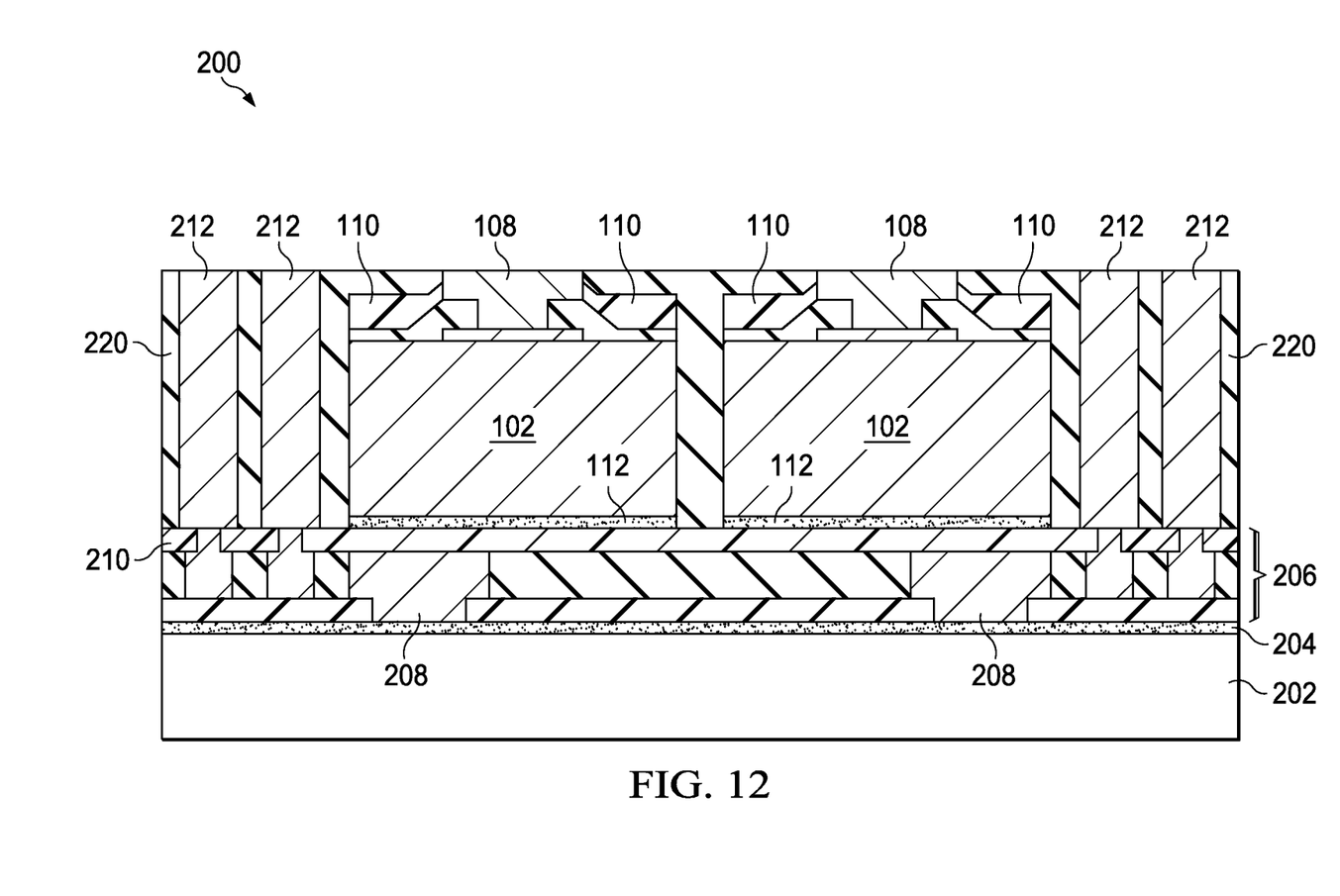

In the process step illustrated in FIG. 12, molding compound 220 is ground back to reduce its overall thickness and thus expose conductive vias 212. Because the resulting structure includes conductive vias 212 that extend through molding compound 220, conductive vias 212 may also be referred to as through molding vias, through intervias (TIVs), and the like. Conductive vias 212 provide electrical connections to backside RDLs 206 in package 200.

Furthermore, after molding compound 220 is thinned back, a top surface of passivation layer 110 remains covered by molding compound 220. That is, molding compound 220 may extend smoothly over passivation layer 110. The interfacial surface area between molding compound 220 and passivation layer 110 is increased in embodiments where passivation layer 110 is a conformal layer as well as in embodiments where passivation layer 110 is a non-conformal layer. Because the interface surface area between molding compound 220 and passivation layer 110 is increased compared to traditional packages, de-wetting and/or delamination issues of passivation layer 110 may be reduced in package 200.

In the embodiment illustrated by FIG. 12, a top surface of conductive pillars 108 is higher than a top surface of passivation layer 110. Therefore, the thinning process used to expose conductive vias 212 may further expose conductive pillars 108. In alternative embodiments, top surfaces of conductive pillars 108 and passivation layer 110 may be substantially level (e.g., see FIG. 4C). In such embodiments, an additional patterning process (e.g., photolithography and/or etching) may be performed on molding compound 220 after thinning to expose conductive pillars 108.

Figure 13:
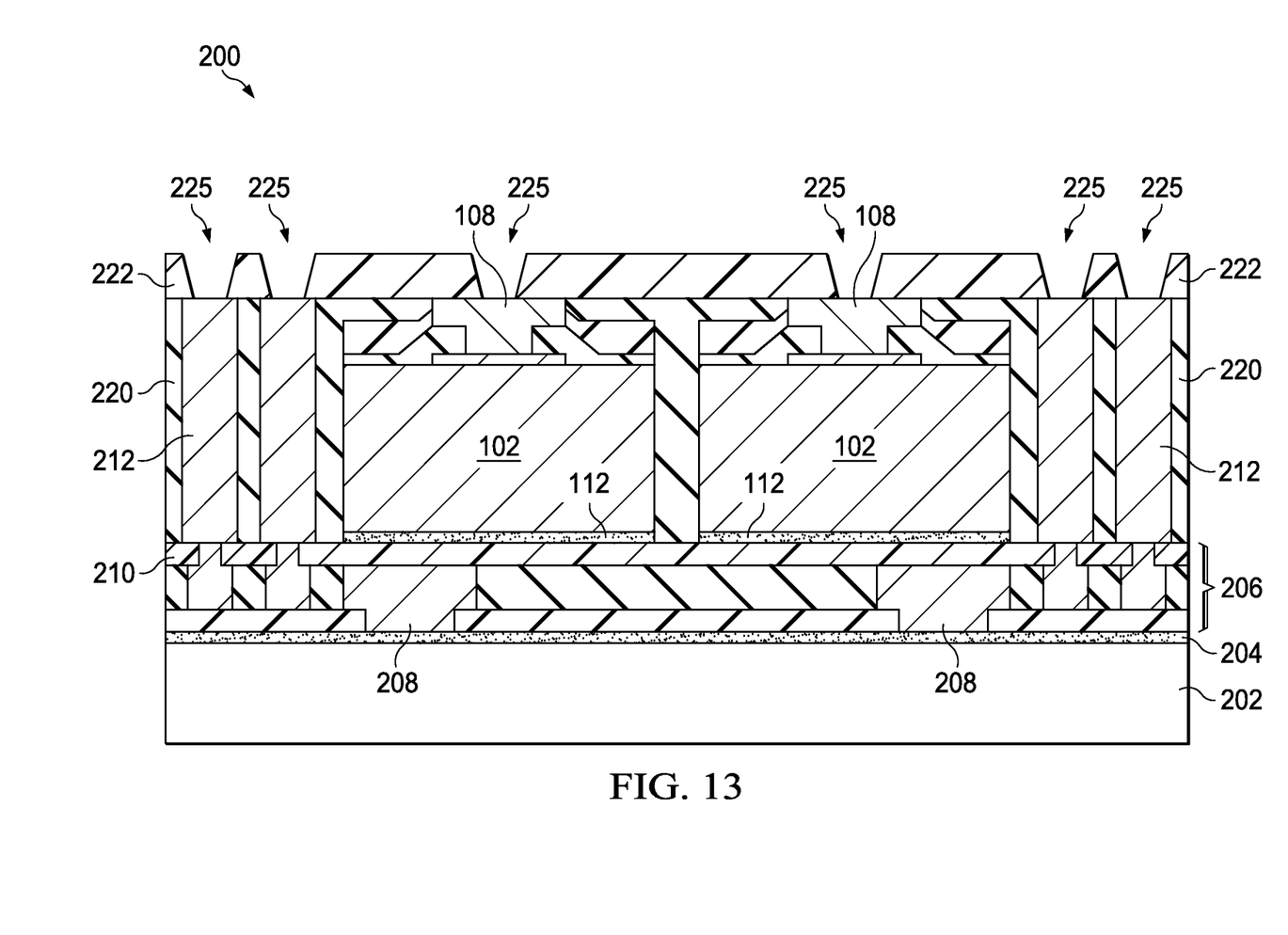
Figure 14:
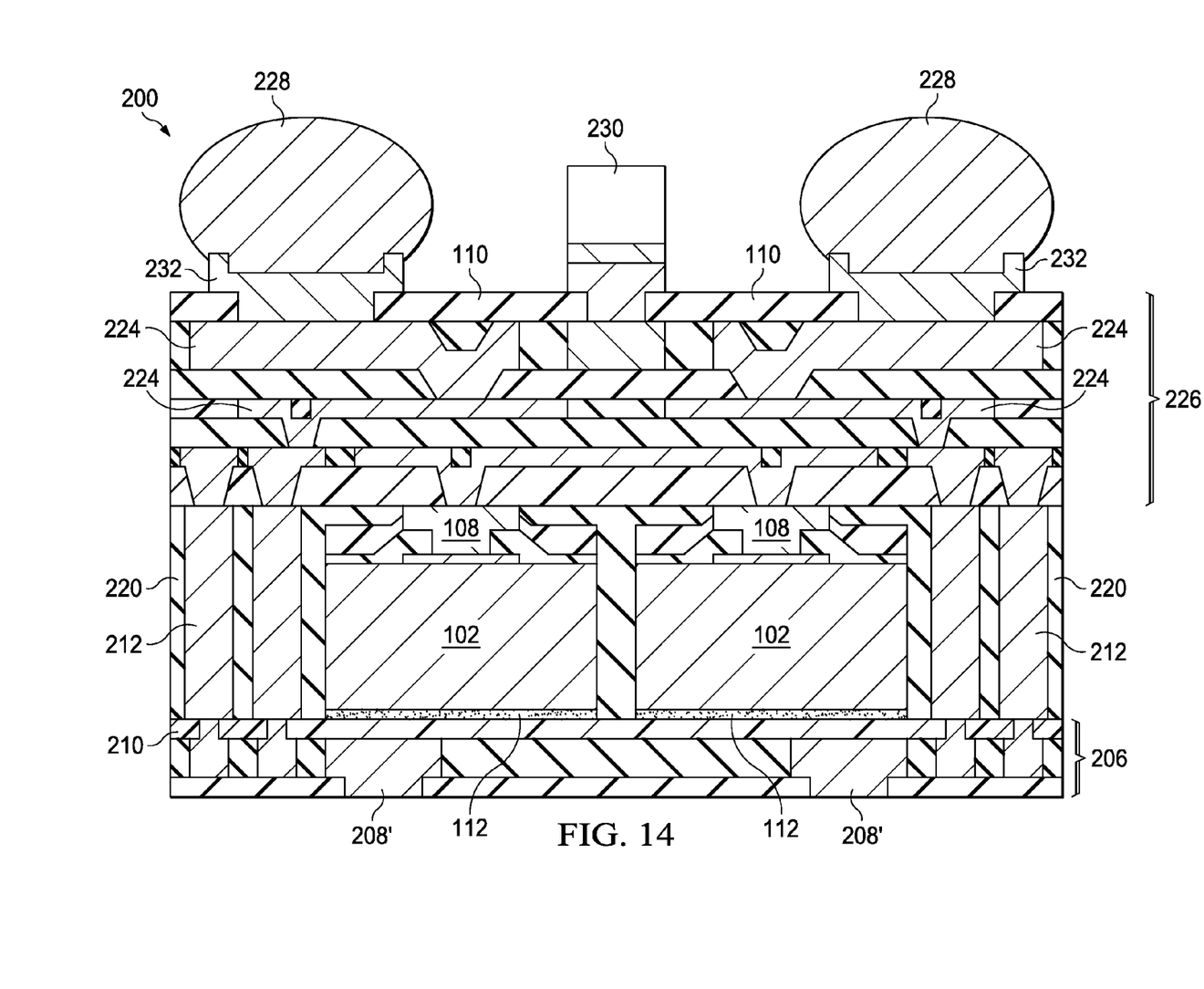

FIGS. 13 and 14 illustrate process steps of forming RDLs 226 (see FIG. 14) having conductive features 224 (e.g., vias and/or contacts) electrically connected to conductive pillar 108. FIG. 13 illustrates the formation of a patterned polymer layer 222 having openings 225. Polymer layer 222 may comprise PI, PBO, BCB, epoxy, silicone, acrylates, nano-filled pheno resin, siloxane, a fluorinated polymer, polynorbornene, and the like, for example. In some embodiments, polymer layer 222 may comprise a high temperature curing polymer while passivation layer 110 comprises a low temperature curing polymer. For example, after deposition, polymer layer 222 may be cured at a higher temperature (e.g., greater than about 320° Celsius) than a curing temperature (e.g., less than about 250° Celsius) used for passivation layer 110. The difference in curing temperatures may be due to the use of two different polymer materials for passivation layer 110 and polymer layer 222, which may be selected to meet different process conditions of forming different layers in package 200. Alternatively, passivation layer 110 and polymer layer 222 may comprise a same material, or other suitable materials could be employed in lieu of a polymer for layer 222.

Polymer layer 222 may be formed using a blanket deposition process (e.g., spin-on coating, sputtering, and the like) over molding compound 220 and dies 102. After deposition, polymer layer 222 may be patterned to include openings 225 using photolithography and/or etching processes, for example. Openings 225 may expose conductive pillars 108 and conductive vias.

In some embodiments, there is an absence of any interface between passivation layer 110 and polymer layer 222. For example, the configuration of molding compound 220 prevents the formation of any interface between passivation layer 110 and polymer layer 222. This absence of an interface between, e.g. these two layers to further reduce the likelihood and/or severity of de-wetting and/or delamination of the passivation layer (e.g., passivation layer 110).

Furthermore, molding compound 220 and polymer layer 222 may have a smooth, continuous interface over at least a portion of die 102, improving adhesion and reducing de-wetting and/or delamination issues. For example, in the illustrated embodiment, polymer layer 222 and molding compound 220 has a continuous, uninterrupted interface extending from a point over die 102 (e.g., an edge of conductive pillar 108) to a conductive via 212. This continuous interface covers a portion of passivation layer 110. A sidewall boundary between molding compound 220 and die 102 is physically separated from the interface between molding compound 220 and polymer layer 222 by the inclusion of additional molding compound material disposed over die 102. This configuration of die 102, molding compound 220, and polymer layer 222 further improves adhesion and reduces the potential for de-wetting/delamination in package 200.

Subsequently, openings 225 may be filled with a conductive material. For example, a seed layer (not shown) may be formed in openings 225 and a conductive material may be plated in openings 225 using an electrochemical plating process, electroless plating process, and the like. The resulting vias (see FIG. 14) in polymer layer 222 may be electrically connected to conductive pillars 108 and/or conductive vias 212.

Additional polymer layers having conductive features may be formed over polymer layer 222. For example, FIG. 14 illustrates RDLs 226 having conductive features 224 formed therein. RDLs 226 may be substantially similar to backside RDLs 206 both in composition and formation process. For example, RDLs 226 may include conductive features 224 (e.g., conductive lines and vias) disposed between various polymer layers. Conductive features 224 are electrically connected to dies 102 through conductive pillars 108. Additional detailed description of RDLs 226 is omitted for brevity.

Additional package features, such as external connectors 228 and other surface mount devices (SMDs) 230 may be disposed over RDLs 226. Connectors 228 may be ball grid array (BGA) balls, controlled collapse chip connector (C4) bumps, and the like disposed on under metal metallurgies (UBMs) 232, which may be formed over RDLs 226. Connectors 228 and SMDs 230 may be electrically connected to one or more dies 102 by way of RDLs 226. Connectors 228 may be used to electrically connect package 200 to other package components such as another device die, interposers, package substrates, printed circuit boards, a mother board, and the like.

As further illustrated by FIG. 14, package 200 may be removed from carrier 202 by removing temporary adhesive layer 204. The removal process of adhesive layer 204 may include applying heat to a LTHC layer, exposing an UV tape to UV light, and the like. The removal of carrier 202 may expose additional input/output contacts in package 200. For example, conductive features in backside RDL 206 (e.g., contact pads 208') may also be used to electrically connect package 200 other package components such as memory dies or any other the package component.

Various embodiments described above reduce de-wetting and/or delamination issues between passivation layers of dies and other features in a device package (e.g., an InFO package). A top-most passivation layer may be formed over the die, and the top-most passivation layer may be a polymer layer which is an interfacial, insulation, and/or protection layer. The polymer passivation layer may be formed over the device die while still exposing and not covering a top surface of conductive pillars (or another suitable contact) of the device die. The polymer passivation layer may be a conformal layer (e.g., having tapered sidewalls) or a non-conformal layer.

When the die is mounted on a device package, a molding compound may be dispensed over the die. Because the passivation layer does not cover a top surface of the conductive pillar, the molding compound may expose the conductive pillar while still covering the passivation layers of the device die. That is, the molding compound may extend continuously over a top surface of the device die. Thus adhesion between the molding compound and the device die may be improved. Furthermore, in embodiments where the polymer passivation layer is a conformal layer having tapered sidewalls, the taper angle of such sidewalls may further increase the interfacial surface area between the die and the molding compound and further improve adhesion. When additional interconnect layers (e.g., RDLs having additional polymer layers) are formed over the molding compound, these interconnect layers have a continuous, uninterrupted interface with the molding compound over at least a portion of the die. In some embodiments, the continuous interface may extend from a conductive via disposed in the molding compound to the conductive pillar of the die. Thus, the configuration of an embodiment device package reduces de-wetting and/or delamination issues and increases yield.

In accordance with an embodiment, a device package includes a die having a conductive pillar and a molding compound extending along sidewalls of the die. The molding compound at least partially covers a top surface of the die. The device package further includes a conductive via extending through the molding compound and a redistribution layer (RDL) over the molding compound. The RDL and the molding compound have a continuous interface extending from the conductive via to a point over the die.

In accordance with another embodiment, device package includes a die. The die includes a contact pad, a first polymer layer on a top surface of the die, and a conductive pillar extending through the first polymer layer and electrically connected to the contact pad. A molding extends along sidewalls of the die, and the molding compound covers a top surface of the first polymer layer. A conductive via extends through the molding compound. The device package further includes one or more redistribution layers (RDLs). The one or more RDLs include a second polymer layer over the molding compound and a conductive feature electrically connected to the conductive pillar. The second polymer layer and the molding compound have a continuous interface extending from the conductive via to the conductive pillar.

In accordance with yet another embodiment, a method includes providing a die having a conductive pillar. The method further includes forming a passivation layer over the provided die, where the conductive pillar extends through the passivation layer. The die is mounted to a carrier, and a molding compound is formed over the mounted die. The molding compound covers a top surface of the passivation layer. The method further includes forming a redistribution layer (RDL) over the molding compound and forming a connector over the RDL. The connector is electrically connected to the conductive pillar. The molding compound separates the RDL from the passivation layer, and the RDL and the molding compound have a continuous interface extending from a point over the die past a sidewall of the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
a die comprising a conductive pillar;
a molding compound extending along sidewalls of the die, wherein the molding compound at least partially covers a top surface of the die;
a conductive via extending through the molding compound; and
a redistribution layer (RDL) over the molding compound, wherein the RDL and the molding compound comprise a continuous interface extending from the conductive via to the conductive pillar.

2. The device package of claim 1, further comprising:
a first passivation layer formed on the die; and
a second passivation layer over the first passivation layer, wherein the conductive pillar extends through the first and the second passivation layers, and wherein the molding compound covers a top surface of the second passivation layer.

3. The device package of claim 2, wherein the second passivation layer comprises a tapered sidewall extending along the conductive pillar, wherein tapered sidewall comprises an obtuse angle relative a horizontal plane of about 110° to about 170°, and wherein the horizontal plane is substantially parallel to a major surface of the die.

4. The device package of claim 2, wherein a top surface of the second passivation layer is substantially level.

5. The device package of claim 1, wherein the RDL comprises a conductive feature electrically connected to the conductive pillar.

6. The device package of claim 1, wherein a top surface of the molding compound is substantially level with the top surface of the conductive pillar.

7. A device package comprising:
a die comprising:
a contact pad;
a first polymer layer on a top surface of the die; and
a conductive pillar extending through the first polymer layer and electrically connected to the contact pad;
a molding compound extending along sidewalls of the die, wherein the molding compound covers a top surface of the first polymer layer;
a conductive via extending through the molding compound; and
one or more redistribution layers (RDLs), the one or more RDLs comprising:
a second polymer layer over the molding compound, wherein the second polymer layer and the molding compound comprise a continuous interface extending from the conductive via to the conductive pillar; and
a conductive feature electrically connected to the conductive pillar.

8. The device package of claim 7, further comprising one or more backside RDLs disposed on an opposing side of the die as the one or more RDLs, wherein the conductive via electrically connects the one or more RDLs to the one or more backside RDLs.

9. The device package of claim 7 further comprising a surface mount device (SMD) over the one or more RDLs and electrically connected to the die.

10. The device package of claim 7, wherein a top surface of the conductive pillar is higher than the top surface of the first polymer layer.

11. The device package of claim 7, wherein the first polymer layer comprises a tapered sidewall adjacent the conductive pillar.

12. The device package of claim 7, wherein the molding compound separates the first polymer layer from the second polymer layer from having an interface.

13. The device package of claim 7 further comprising a connector over the one or more RDLs and electrically connected to the die.

14. A method for forming a package structure comprising:
providing a die comprising a conductive pillar;
forming a passivation layer over the provided die, wherein the conductive pillar extends through the passivation layer;
mounting the die to a carrier;
forming a molding compound over the mounted die, wherein the molding compound covers a top surface of the passivation layer;
forming a redistribution layer (RDL) over the molding compound, wherein the molding compound separates the RDL from the passivation layer, and wherein the RDL and the molding compound comprise a continuous interface extending from a point over the die past a sidewall of a die; and
forming a connector over the RDL and electrically connected to the conductive pillar.

15. The method of claim 14, wherein forming the passivation layer comprises a spin-on coating process.

16. The method of claim 15, wherein after the spin-on coating process, the conductive pillar is at least partially exposed by the passivation layer.

17. The method of claim 14, wherein forming the passivation layer comprises:
    blanket depositing the passivation layer over the provided die; and
    patterning the passivation layer to expose a top surface of the conductive pillar.

18. The method of claim 14, wherein mounting the die to the carrier comprises:
    forming temporary adhesive layer over the carrier;
    forming a backside RDL over the temporary adhesive layer; and
    mounting the die on the backside RDL.

19. The method of claim 18, further comprising forming a conductive via extending through the molding compound, wherein the conductive via electrically connects the RDL to the backside RDL.

20. The method of claim 14, wherein forming the passivation layer comprises forming the passivation layer to have a tapered sidewall adjacent the conductive pillar.

* * * * *